(12) United States Patent
Seo et al.

(10) Patent No.: US 11,715,739 B2
(45) Date of Patent: Aug. 1, 2023

(54) DISPLAY DEVICE AND MANUFACTURING METHOD THEREOF

(71) Applicant: Samsung Display Co., Ltd., Yongin-Si (KR)

(72) Inventors: Jong Oh Seo, Seoul (KR); Jong Jun Baek, Seoul (KR)

(73) Assignee: Samsung Display Co., Ltd., Yongin-Si (KR)

( * ) Notice: Subject to any disclaimer, the term of this patent is extended or adjusted under 35 U.S.C. 154(b) by 118 days.

(21) Appl. No.: 17/338,738

(22) Filed: Jun. 4, 2021

(65) Prior Publication Data
US 2022/0077261 A1   Mar. 10, 2022

(30) Foreign Application Priority Data

Sep. 8, 2020 (KR) .................. 10-2020-0114711

(51) Int. Cl.
*H01L 27/32* (2006.01)
*H01L 51/56* (2006.01)
(Continued)

(52) U.S. Cl.
CPC .... *H01L 27/1222* (2013.01); *H01L 21/02068* (2013.01); *H01L 21/02532* (2013.01);
(Continued)

(58) Field of Classification Search
CPC .......... H01L 27/1222; H01L 27/1274; H01L 29/78696; H01L 21/02675; H01L 21/02658; H01L 21/32155
See application file for complete search history.

(56) References Cited

U.S. PATENT DOCUMENTS 4,894,699 A * 1/1990 Hayashi .................. H01L 31/09
  257/E27.128
5,219,767 A * 6/1993 Kohno .............. H01L 21/02488
  438/320
(Continued)

FOREIGN PATENT DOCUMENTS

CN  101232041 A * 7/2008 ......... H01L 21/2053
CN  101436606 A * 5/2009 ......... H01L 27/2463
(Continued)

OTHER PUBLICATIONS

Machine translation, Kim, Chinese Pat. Pub. No. CN-101232041-A, translation date: Nov. 25, 2022, Clarivate Analytics, all pages. (Year: 2022).*

(Continued)

*Primary Examiner* — Victoria K. Hall
(74) *Attorney, Agent, or Firm* — Innovation Counsel LLP

(57) ABSTRACT

An embodiment provides a manufacturing method of a polycrystalline silicon layer, including: forming a first amorphous silicon layer on a substrate; doping an N-type impurity into the first amorphous silicon layer; forming a second amorphous silicon layer on the n-doped first amorphous silicon layer; doping a P-type impurity into the second amorphous silicon layer; and crystalizing the n-doped first amorphous silicon layer and the p-doped second amorphous silicon layer by irradiating a laser beam onto n-doped first amorphous silicon layer and the p-doped second amorphous silicon layer to form a polycrystalline silicon layer.

25 Claims, 18 Drawing Sheets

(51) Int. Cl.
　　　*H01L 27/12* (2006.01)
　　　*H01L 29/786* (2006.01)
　　　*H01L 21/3215* (2006.01)
　　　*H01L 21/02* (2006.01)
　　　*H10K 59/124* (2023.01)
　　　*H10K 71/00* (2023.01)
　　　*H10K 59/123* (2023.01)
　　　*H10K 59/12* (2023.01)

(52) U.S. Cl.
　　CPC .. *H01L 21/02658* (2013.01); *H01L 21/02675* (2013.01); *H01L 21/32155* (2013.01); *H01L 27/1274* (2013.01); *H01L 29/78696* (2013.01); *H10K 59/124* (2023.02); *H10K 71/00* (2023.02); *H10K 59/1201* (2023.02); *H10K 59/123* (2023.02)

(56) References Cited

U.S. PATENT DOCUMENTS

| | | | | |
|---|---|---|---|---|
| 5,667,597 | A * | 9/1997 | Ishihara | H01L 31/03762 136/258 |
| 6,180,444 | B1 * | 1/2001 | Gates | H01L 29/861 438/237 |
| 6,605,497 | B2 * | 8/2003 | Yamazaki | H01L 29/78678 257/E29.294 |
| 6,608,326 | B1 * | 8/2003 | Shinagawa | H01L 21/02595 257/70 |
| 6,636,280 | B1 * | 10/2003 | Miyazawa | H01L 29/66757 438/30 |
| 6,693,044 | B1 * | 2/2004 | Yamazaki | H01L 21/02532 257/E21.414 |
| 7,553,715 | B2 * | 6/2009 | You | H01L 21/2026 438/166 |
| 2002/0043660 | A1 * | 4/2002 | Yamazaki | H01L 29/78621 257/E21.414 |
| 2003/0010980 | A1 * | 1/2003 | Yamazaki | H01L 27/1285 257/65 |
| 2003/0082859 | A1 * | 5/2003 | Ichijo | H01L 21/02672 438/166 |
| 2005/0142676 | A1 * | 6/2005 | Oh | H01L 29/66765 257/E21.414 |
| 2006/0260675 | A1 * | 11/2006 | Sugawara | H01L 31/1055 257/E31.062 |
| 2008/0156368 | A1 * | 7/2008 | Hirose | H01L 23/60 136/256 |
| 2009/0178711 | A1 * | 7/2009 | Joo | H01L 21/02532 136/258 |
| 2010/0240165 | A1 * | 9/2010 | Jang | H01L 31/202 438/58 |
| 2011/0146759 | A1 * | 6/2011 | Lee | H01L 31/1864 257/E31.113 |
| 2014/0190552 | A1 | 7/2014 | Campbell et al. | |
| 2015/0280048 | A1 * | 10/2015 | Jeong | H01L 31/068 438/97 |
| 2018/0114866 | A1 * | 4/2018 | Lee | H01L 29/78621 |
| 2019/0067396 | A1 | 2/2019 | Cheng et al. | |
| 2019/0067609 | A1 * | 2/2019 | Yan | H01L 51/0562 |
| 2021/0005452 | A1 * | 1/2021 | Hong | G01C 21/3469 |

FOREIGN PATENT DOCUMENTS

| | | | | |
|---|---|---|---|---|
| CN | 104576399 | A * | 4/2015 | ......... H01L 29/0684 |
| CN | 104576399 | B | 8/2017 | |
| CN | 113451445 | A * | 9/2021 | ......... H01L 31/182 |
| FR | 2883663 | A1 * | 9/2006 | ......... H01L 31/0745 |
| KR | 10-2017-0059502 | * | 5/2017 | ......... H01L 21/3215 |
| KR | 10-2017-0059502 | A | 5/2017 | |
| KR | 10-1791727 | B1 | 10/2017 | |
| KR | 10-2020-0058622 | A | 5/2020 | |

OTHER PUBLICATIONS

Machine translation, Huet, French Pat. Pub. No. FR-2883663-A1, translation date: Nov. 25, 2022, Clarivate Analytics, all pages. (Year: 2022).*

Machine translation, Choo, Korean Pat. Pub. No. KR20170059502A, translation date: Nov. 20, 2022, Espacenet, all pages. (Year: 2022).*

Machine translation, Kinoshita, Chinese Pat. Pub. No. CN-101436606-A, translation date: Nov. 25, 2022, Clarivate Analytics, all pages. (Year: 2022).*

Machine translation, Wang, Chinese Pat. Pub. No. CN-104576399-A, translation date: Nov. 20, 2022, Espacenet, all pages. (Year: 2022).*

Machine translation, Unnamed Inventor, Chinese Pat. Pub. No. CN-113451445-A, translation date: Nov. 25, 2022, Clarivate Analytics, all pages. (Year: 2022).*

Yasuhiro Sato and Masahiko Maeda, "Study of HF-Treated Heavily-Doped Si Surface Using Contact Angle Measurements", Japanese Journal of Applied Physics, vol. 33 (1994), Part 1, No. 12A, pp. 6508-6513, 6pages, Dec. 1994, accepted for publication Oct. 15, 1994, Japan.

Extended European Search Report, Application No. 21195157.9, dated Feb. 15, 2022, 9 pages.

* cited by examiner

DISPLAY DEVICE AND MANUFACTURING METHOD THEREOF

CROSS-REFERENCE TO RELATED APPLICATION

This application claims priority to and benefits of Korean Patent Application No. 10-2020-0114711, filed in the Korean Intellectual Property Office on Sep. 8, 2020, the entire contents of which are incorporated herein by reference.

BACKGROUND

1. Field

The present disclosure relates to a method of manufacturing a polycrystalline silicon layer, a display device including a polycrystalline silicon layer manufactured thereby, and a method of manufacturing the same, and more particularly, to a method of manufacturing a polycrystalline silicon layer having excellent device characteristics and reduced defects, a display device including the polycrystalline silicon layer manufactured thereby, and a method of manufacturing the same.

2. Description of the Related Art

Among display devices, a flat panel display is in the spotlight because it can be lighter and thinner. Among flat panel displays, an electroluminescent display is a self-luminous display that displays an image using a light emitting diode that emits light, and does not require a separate light source. In addition, the electroluminescent display is attracting attention as a next-generation display device because it has low power consumption, a high luminance, and a high reaction speed.

The electroluminescent display described above includes a circuit for driving a light emitting diode in a pixel that includes a plurality of transistors and at least one capacitor.

As a thin film transistor used in such a circuit, a polycrystalline silicon thin film transistor having excellent electron mobility may be used. The polycrystalline silicon thin film transistor has higher electron mobility than an amorphous silicon thin film transistor, and has excellent stability against light irradiation. Accordingly, the polycrystalline silicon thin film transistor may be suitable for use as an active layer of a driving transistor and/or switching transistor of an emissive display device.

Since a characteristic of the polycrystalline silicon layer determines characteristics of a transistor and a display device including the same, manufacturing a polycrystalline silicon layer having excellent characteristics and having few surface defects to improve device characteristics has become an important task in a display field.

The above information disclosed in this Background section is only for enhancement of understanding of the background of the described technology, and therefore it may contain information that does not form the prior art that is already known in this country to a person of ordinary skill in the art.

SUMMARY

Embodiments have been made in an effort to provide a method of manufacturing a polycrystalline silicon layer capable of reducing circular spots while obtaining excellent device characteristics, a display device including a polycrystalline silicon layer manufactured thereby, and a method of manufacturing the same.

An embodiment provides a manufacturing method of a polycrystalline silicon layer, including: forming a first amorphous silicon layer on a substrate; doping an N-type impurity into the first amorphous silicon layer; forming a second amorphous silicon layer on the n-doped first amorphous silicon layer; doping a P-type impurity into the second amorphous silicon layer; and crystalizing the n-doped first amorphous silicon layer and the p-doped second amorphous silicon layer by irradiating a laser beam onto the n-doped first amorphous silicon layer and the p-doped second amorphous silicon layer to form a polycrystalline silicon layer.

The method further including cleaning the substrate before the crystalizing the n-doped first amorphous silicon layer and the p-doped second amorphous silicon layer. The cleaning of the substrate may include cleaning the substrate with hydrofluoric acid, and rinsing the substrate with deionized water.

A thickness of the first amorphous silicon layer may be 150 Å or more and 250 Å or less.

A thickness of the second amorphous silicon layer may be 150 Å or more and 250 Å or less.

The doping of the N-type impurity may proceed with an acceleration voltage of more than 0 and 20 keV or less and a dose of 1e14 atoms/cm$^2$ or more and 1e16 atoms/cm$^2$ or less.

The doping of the P-type impurity may proceed with an acceleration voltage of more than 0 and 20 keV or less and a dose of 1e14 atoms/cm$^2$ or more and 1e16 atoms/cm$^2$ or less.

A contact angle with respect to water measured on a surface of the amorphous silicon layer may be less than 20 degrees after the cleaning of the amorphous silicon layer with hydrofluoric acid.

An embodiment provides a display device including: a substrate; a thin film transistor disposed on the substrate; a display element disposed on the thin film transistor, wherein the thin film transistor may include an active pattern disposed on the substrate, the active pattern including a source region, a drain region, and a channel region disposed between the source region and the drain region; a gate insulating layer disposed on the active pattern; and a gate electrode disposed on the gate insulating layer in a region corresponding to the channel region, and the channel region includes an N-type impurity and a P-type impurity.

Concentration of the P-type impurity may increase as the channel region approaches the gate insulating layer.

Concentration of the N-type impurity may increase as a distance from the gate insulating layer increases.

The P-type impurity may be any one of boron (B) and fluorine (F).

The N-type impurity may be phosphorus (P).

A thickness of the active pattern may be 300 Å or more and 500 Å or less.

Concentration of the P-type impurity in the channel region may be 1e14 atoms/cm$^2$ or more and 1e16 atoms/cm$^2$ or less.

Concentration of the N-type impurity in the channel region may be 1e14 atoms/cm$^2$ or more and 1e16 atoms/cm$^2$ or less.

Concentration of the P-type impurity and concentration of the N-type impurity within the channel region may be substantially the same.

The thin film transistor may further include a source electrode and a drain electrode that are electrically connected to the source region and the drain region, respectively.

The display element may include: a first electrode electrically connected to the thin film transistor; an emission layer disposed on the first electrode; and a second electrode disposed on the emission layer.

An embodiment provides a manufacturing method of a display device, including: forming a first amorphous silicon layer on a substrate; doping an N-type impurity into the first amorphous silicon layer; forming a second amorphous silicon layer on the first amorphous silicon layer; doping a P-type impurity into the second amorphous silicon layer; crystalizing the n-doped first amorphous silicon layer and the p-doped second amorphous silicon layer by irradiating a laser beam onto the n-doped first amorphous silicon layer and the p-doped second amorphous to form a polycrystalline silicon layer; forming a polycrystalline silicon pattern by patterning the polycrystalline silicon layer; forming a gate insulating layer on the polycrystalline silicon pattern; forming a gate electrode on the gate insulating layer; forming a source region, a drain region, and a channel region by doping the source region and the drain region; and forming a display element on the gate electrode.

The method may further include cleaning the substrate before the crystalizing the n-doped first amorphous silicon layer and the p-doped second amorphous silicon layer. The cleaning of the substrate may include: cleaning the substrate with hydrofluoric acid; and rinsing the substrate with deionized water.

The doping of the N-type impurity may proceed with an acceleration voltage of more than 0 and 20 keV or less and a dose of 1e14 atoms/cm² or more and 1e16 atoms/cm² or less.

The doping of the P-type impurity may proceed with an acceleration voltage of more than 0 and 20 keV or less and a dose of 1e14 atoms/cm² or more and 1e16 atoms/cm² or less.

A contact angle with respect to water measured on a surface of the amorphous silicon layer may be less than 20 degrees after the washing of the amorphous silicon layer with hydrofluoric acid.

The forming the source region, the drain region, and the channel region by doping the source region and the drain region may be performed by an ion implantation using the gate electrode as a mask.

The display device may further include forming a source electrode and a drain electrode that are respectively electrically connected to the source region and the drain region on the gate electrode.

The forming of the display element may include: forming a first electrode electrically connected to the active pattern on the gate electrode; forming an emission layer on the first electrode; and forming a second electrode on the emission layer.

According to the embodiments, excellent device characteristics may be obtained by reducing protrusions on the surface of the polycrystalline silicon layer, and the polycrystalline silicon layer with reduced circular spots and the display device including the same may be obtained.

DETAILED DESCRIPTION

Figure 1:
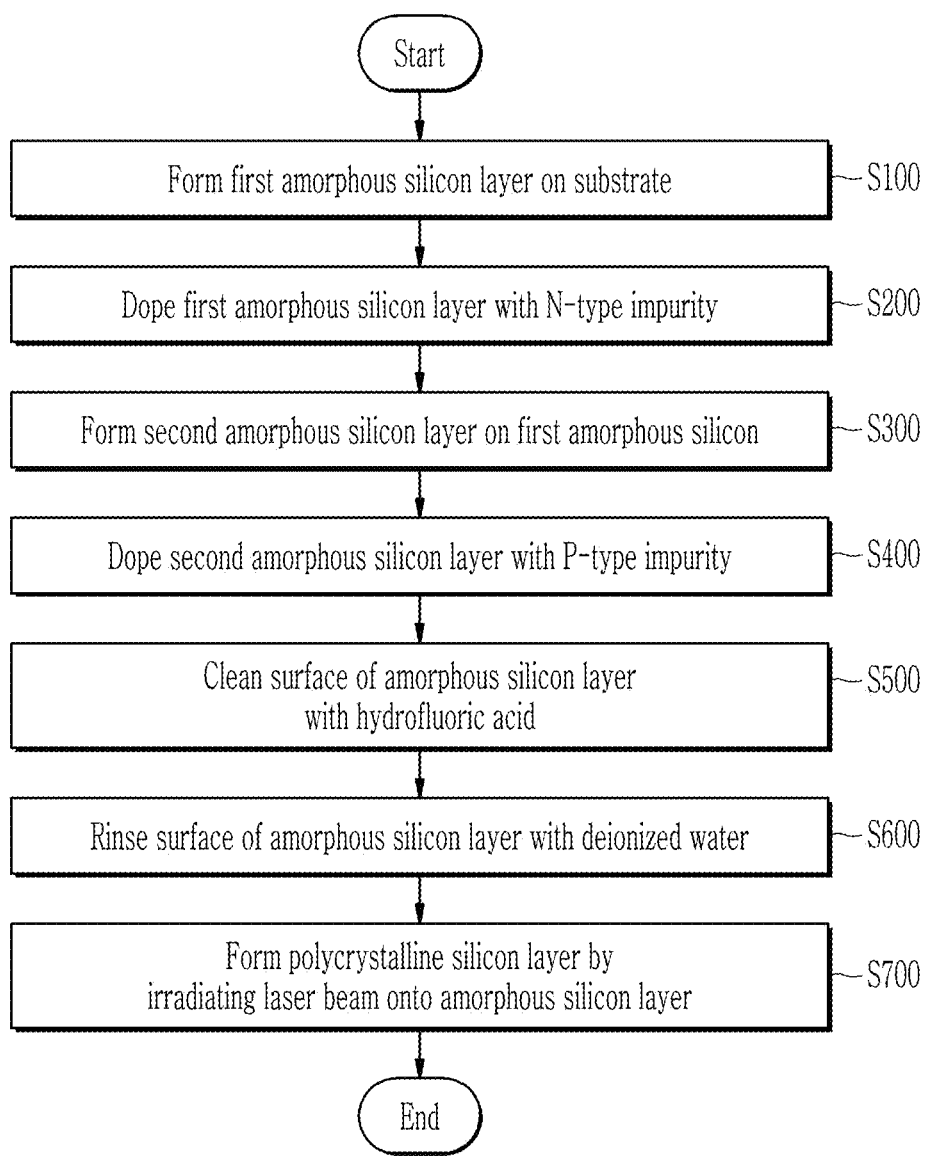
FIG. 1 illustrates a manufacturing method of a polycrystalline silicon layer according to an embodiment.

The present inventive concept will be described more fully hereinafter with reference to the accompanying drawings, in which embodiments of the inventive concept are shown. As those skilled in the art would realize, the described embodiments may be modified in various different ways, all without departing from the spirit or scope of the present inventive concept.

To clearly describe the present inventive concept, parts that are irrelevant to the description are omitted, and like numerals refer to like or similar constituent elements throughout the specification.

Further, since sizes and thicknesses of constituent members shown in the accompanying drawings are arbitrarily given for better understanding and ease of description, the present inventive concept is not limited to the illustrated sizes and thicknesses. In the drawings, the thicknesses of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-sectional view" means when a cross-section taken by vertically cutting an object portion is viewed from the side.

Hereinafter, a manufacturing method of a polycrystalline silicon layer according to an embodiment will be described with reference to FIG. 1 to FIG. 8.

FIG. 1 illustrates a manufacturing method of a polycrystalline silicon layer according to an embodiment. FIG. 2 to FIG. 8 illustrate a manufacturing method of a polycrystalline silicon layer according to an embodiment.

Figure 2:
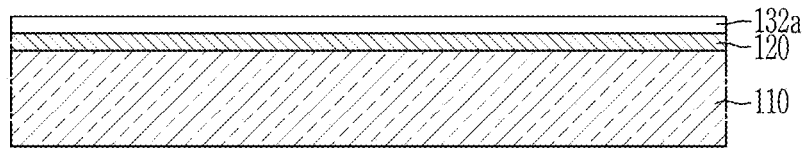
FIG. 2, 3, 4, 5, 6, 7 and FIG. 8 illustrate a manufacturing method of a polycrystalline silicon layer according to an embodiment.

Referring to FIG. 1 and FIG. 2, a buffer layer 120 and a first amorphous silicon layer 132*a* may be sequentially formed on a substrate 110 (S100).

The substrate 110 may be an insulating substrate including glass, quartz, ceramic, or the like. According to an embodiment, the substrate 110 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The substrate 110 may include a flexible material that can be bent or folded, and may be a single layer or multiple layers. A single or multi-layered barrier layer (not illustrated) may be further included on the substrate 110, and the barrier layer may include, e.g., an inorganic insulating material such as a silicon nitride ($SiN_x$), a silicon oxide ($SiO_x$), or a silicon oxynitride ($SiO_xN_y$).

A buffer layer 120 may be disposed on the substrate 110. The buffer layer 120 may provide a flat surface to an upper portion of the substrate 110 and prevent impurities from penetrating through the substrate 110. In the drawing, the buffer layer 120 is illustrated as a single layer, but may be multiple layers according to an embodiment. The buffer layer 120 may be formed to include an organic insulating material or an inorganic insulating material. For example, the buffer layer 120 may include an inorganic insulating material such as a silicon oxide ($SiO_x$), a silicon nitride ($SiN_x$), and a silicon oxinitride ($SiO_xN_y$).

The first amorphous silicon layer 132*a* may be disposed on the buffer layer 120. The first amorphous silicon layer 132*a* may be formed by a method such as low pressure chemical vapor deposition (LPCVD), atmospheric pressure chemical vapor deposition (APCVD), plasma enhanced chemical vapor deposition (PECVD), sputtering, vacuum deposition, or the like. In this case, the first amorphous silicon layer 132*a* may be formed to have a thickness of 150 Å to 250 Å.

Figure 3:
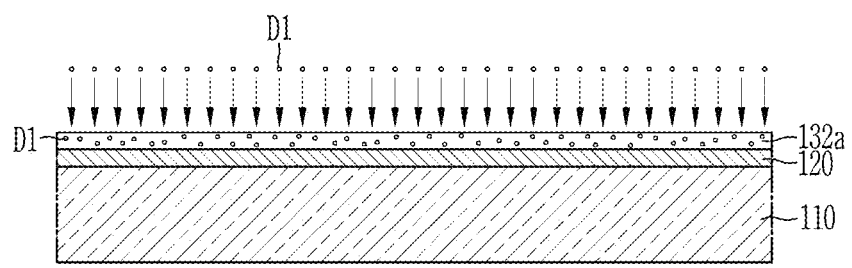

Referring to FIG. 1 and FIG. 3, the first amorphous silicon layer 132*a* may be doped with an N-type impurity D1 to form an n-doped first amorphous silicon layer (S200).

Various methods of doping the N-type impurity D1 may be applied, but an ion implantation method may be used as an embodiment. When the ion implantation method is used, the N-type impurity D1 which is in an ionic state is accelerated to be implanted into the first amorphous silicon layer 132*a*. In the present embodiment, an acceleration voltage for accelerating the N-type impurity D1 may be greater than 0 keV and less than 20 keV. In addition, in this case, a dose of the N-type impurity D1 may be 1e14 atoms/cm$^2$ or more and 1e16 atoms/cm$^2$ or less.

The N-type impurity D1 may include phosphorus (P), arsenic (As), antimony (Sb), or bismuth (Bi). Selectively, the N-type impurity D1 may be phosphorus (P).

Figure 4:
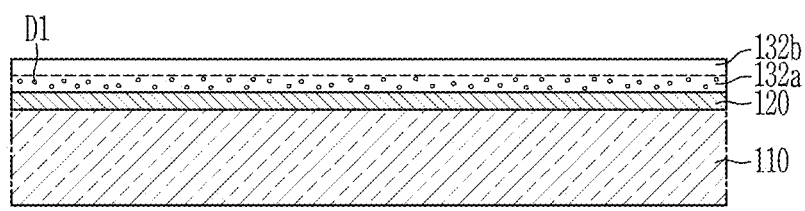

Referring to FIG. 1 and FIG. 4, a second amorphous silicon layer 132*b* may be disposed on the n-doped first amorphous silicon 132*a* (S300).

The second amorphous silicon layer 132*b* is disposed on the n-doped first amorphous silicon layer 132*a*. Similarly to the first amorphous silicon layer 132*a*, the second amorphous silicon layer 132*b* may be formed by a method such as low pressure chemical vapor deposition (LPCVD), atmospheric pressure chemical vapor deposition (APCVD), plasma enhanced chemical vapor deposition (PECVD), sputtering, vacuum deposition, or the like. In this case, the second amorphous silicon layer 132*b* may be formed to have a thickness of 150 Å to 250 Å.

Because the second amorphous silicon layer 132*b* is formed by using a same material and a same method as those of the first amorphous silicon layer 132*a*, a boundary between the first amorphous silicon layer 132*a* and the second amorphous silicon layer 132*b* may not be seen clearly. The first amorphous silicon layer 132*a* and the second amorphous silicon layer 132*b* may be formed as much like a single layer without having a boundary between them.

Figure 5:
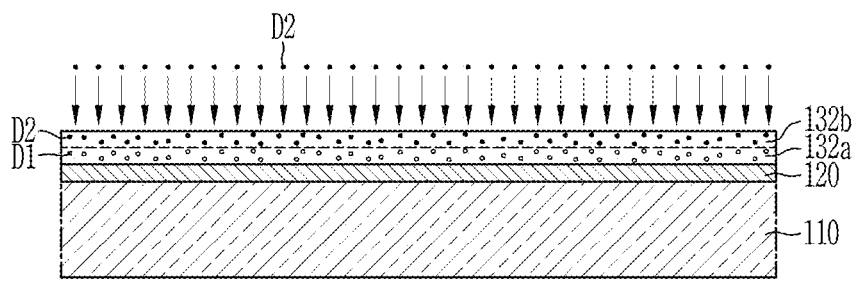

Referring to FIG. 1 and FIG. 5, the second amorphous silicon layer 132*b* may be doped with a P-type impurity D2 to form p-doped second amorphous silicon layer 132*b* (S400).

Various methods of doping the P-type impurity D2 may be applied, but an ion implantation method may be used as an embodiment. When the ion implantation method is used, the P-type impurity D2 which is in an ionic state is accelerated to be implanted into the second amorphous silicon layer 132*b*. In the present embodiment, an acceleration voltage for accelerating the P-type impurity D2 may be greater than 0 keV and less than 20 keV. In addition, in this case, a dose of the P-type impurity D2 may be 1e14 atoms/cm$^2$ or more and 1e16 atoms/cm$^2$ or less. When it is less than 1e14 atom/cm$^2$, the surface of the amorphous silicon layer 132 may not be sufficiently hydrophilized, and when it is more than 1e16 atom/cm$^2$, it is not preferable because it may deteriorate the device characteristics of a transistor manufactured by using it.

The P-type impurity D2 may include boron (B), aluminum (Al), gallium (Ga), and indium (In). Selectively, the P-type impurity D2 may be boron (B).

The amorphous silicon layer 132 may be completed by doping the P-type impurity D2. The p-doped amorphous silicon layer 132 may have a hydrophilic surface. Particularly, a surface of the amorphous silicon layer 132 maintains hydrophilicity by the p-doped amorphous silicon layer 132 even after washing with hydrofluoric acid 210 to be described later, and occurrence of circular spots may be prevented in a subsequent washing and rinsing process.

In addition, since the N-type impurity D1 is contained in the first amorphous silicon layer 132*a*, even when the polycrystalline silicon layer manufactured according to the present embodiment is applied to a transistor device, the characteristics of the device may not be affected.

Particularly, in this case, since the p-doped second amorphous silicon layer 132*b* are formed separately on the n-doped first amorphous silicon layer 132*a*, only the P-type impurity D2 may be present near the surface of the amorphous silicon layer 132.

When the doped N-type impurity D1 is disposed near the surface of the amorphous silicon layer 132, the surface of the amorphous silicon layer 132 may have a hydrophobic characteristic and water droplets may be formed on a surface of the amorphous silicon layer 132 after washing, which may cause circular spots. However, as in the present embodiment, the N-type impurity may be prevented from being present near the surface of the amorphous silicon layer 132 by separately forming the second amorphous silicon layer 132*b* and doping the P-type impurity into the second amorphous silicon layer 132*b* after forming the n-doped first amorphous silicon layer 132*a*.

Figure 6:
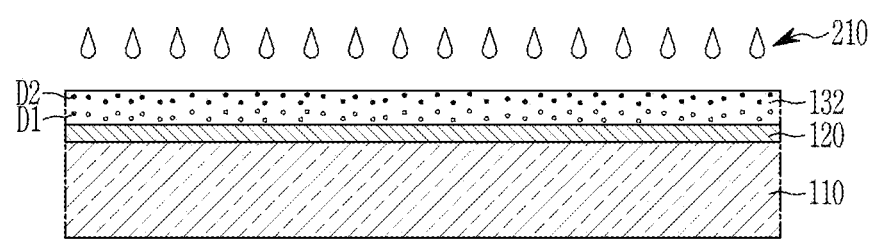

Referring to FIG. 1 and FIG. 6, the surface of the amorphous silicon layer 132 may be cleaned with hydrofluoric acid 210 (S500).

A natural oxide film may be formed on a surface of the amorphous silicon layer 132 due to a reaction between exposed silicon in the amorphous silicon layer 132 and oxygen in the atmosphere. When a natural oxide film remains on the amorphous silicon layer 132, since protrusions having a relatively large thickness may be formed on the surface of the polycrystalline silicon layer by the natural oxide film in a crystallization step, it is necessary to remove them.

To this end, the amorphous silicon layer 132 may be cleaned by using the hydrofluoric acid 210. The hydrofluoric acid 210 may be an aqueous solution in which hydrogen fluoride (HF) is dissolved. For example, the hydrofluoric acid 210 may contain about 0.5% of hydrogen fluoride. The natural oxide film formed on the amorphous silicon layer 132 may be removed by cleaning the amorphous silicon layer 132 with the hydrofluoric acid 210.

In an embodiment, the amorphous silicon layer 132 may be cleaned with the hydrofluoric acid 210 for about 40 seconds to about 70 seconds. When the amorphous silicon layer 132 is cleaned for less than about 40 second, the natural oxide film (NOL) formed on the amorphous silicon layer 132 may not be completely removed. In addition, when the amorphous silicon layer 132 is cleaned for longer than about 70 second, the amorphous silicon layer 132 may be damaged by the hydrofluoric acid 210.

The surface of the amorphous silicon layer 132 cleaned by the hydrofluoric acid 210 to have no native oxide on it generally has a hydrophobic characteristic. Water droplets with cohesive force are relatively easily formed on the hydrophobic surface, and the portion of the amorphous silicon layer 132 on which water droplets have formed may be easily oxidized by $O_2$ or —OH groups in a rinsing process described later, and after crystallization, circular spots may be formed on a poly silicon layer in areas where the water droplets were. Such a circular water mark may cause pixel defects when applied to a display device. However, in an embodiment, the P-type impurity D2 is present near the surface of the amorphous silicon layer 132 by doping it with the P-type impurity D2 as in step S400 above, and thus the surface retains its hydrophilic characteristic even after cleaning it with hydrofluoric acid 210. When a contact angle of the surface to water is measured, it may be less than 20 degrees. In other words, the larger the contact angle, the easier it is for water droplets to be formed on the surface to form circular spots in a subsequent process. In the present embodiment, the surface becomes hydrophilic even after washing it with the hydrofluoric acid 210 due to the p-doped second amorphous silicon layer 132b, so that the contact angle with water may be less than 20 degrees. Therefore, it is possible to prevent the generation of circular spots.

Figure 7:
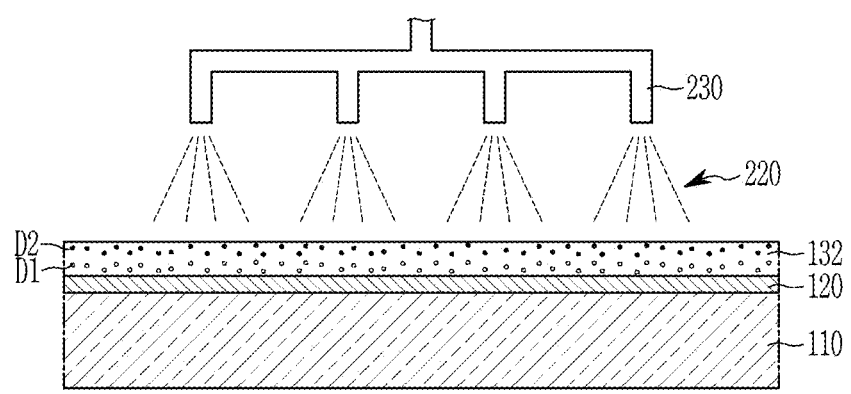

Referring to FIG. 1 and FIG. 7, the surface of the amorphous silicon layer 132 may be rinsed with deionized water 220 (S600).

For example, the substrate 110 is moved under a fixed spray 230, and the deionized water 220 may be supplied to the amorphous silicon layer 132 through the spray 230. The hydrofluoric acid 210 remaining on the amorphous silicon layer 132 may be removed by rinsing the amorphous silicon layer 132 with the deionized water 220.

In particular, in an embodiment, even when the amorphous silicon layer 132 is rinsed using deionized water to which hydrogen is not added, circular defects caused by oxygen after the crystallization step may be prevented. That is, since the P-type impurity D2 exists near the surface of the amorphous silicon layer 132, the hydrophilic characteristics of the surface are maintained even after washing it with the hydrofluoric acid 210, and thus, since water droplets are not formed on the surface, even when oxygen in the deionized water remains and exists, oxidation may not result in a remaining portion in the form of circular spots, thereby preventing generation of circular defects itself. In addition, more selectively, the amorphous silicon layer 132 may be rinsed by using the deionized water 220 to which hydrogen is added at a hydrogen concentration of, e.g., about 1.0 ppm. Accordingly, it is possible to more reliably prevent the circular defects from being formed.

Figure 8:
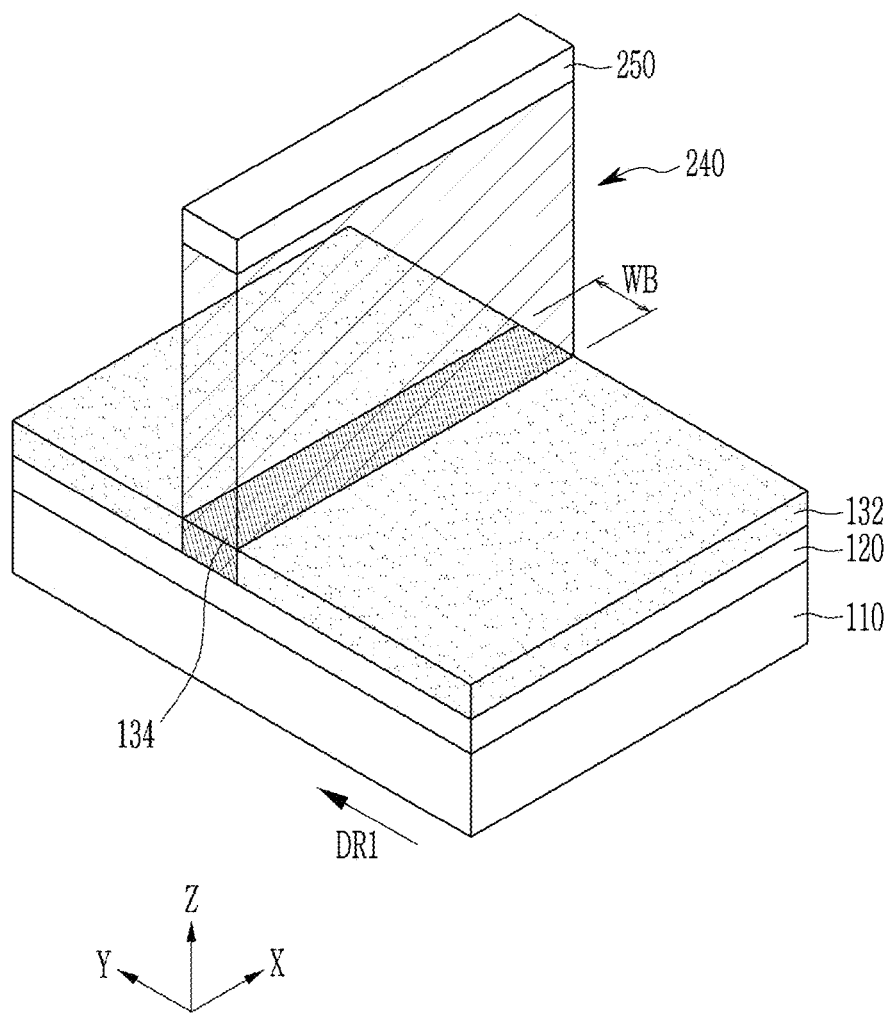

Referring to FIG. 1 and FIG. 8, a polycrystalline silicon layer 134 may be formed by irradiating a laser beam 240 onto the amorphous silicon layer 132 (S700). The laser 250 may intermittently generate a laser beam 240 to irradiate the amorphous silicon layer 132. For example, laser 250 may be an excimer laser that generates the laser beam 240 of a short wavelength, high power, and high efficiency. The excimer laser may use, e.g., an inert gas, an inert gas halide, a mercury halide, an inert gas oxide compound, and a polyatomic excimer. For example, the inert gas may include $Ar_2$, $Kr_2$, $Xe_2$, or the like, the inert gas halide may include ArF, ArCl, KrF, KrCl, XeF, XeCl, or the like, the mercury halide may include HgCl, HgBr, HgI, or the like, the inert gas oxidized compound may include ArO, KrO, XeO, or the like, and the polyatomic excimer may include $Kr_2F$, $Xe_2F$, or the like.

The amorphous silicon layer 132 may be crystallized into the polycrystalline silicon layer 134 by irradiating the laser beam 240 from the laser 250 onto the amorphous silicon layer 132 while moving the substrate 110. The laser 250 may irradiate the laser beam 240 having an energy density of about 450 mJ/cm² to about 500 mJ/cm² onto the amorphous silicon layer 132. In an embodiment, a width WB of the laser beam 240 may be about 480 μm, and a scan pitch of the laser beam 240 in the first direction DR1 may be about 9 μm to about 30 μm. For example, when the scan pitch is about 24 μm, about 24 laser beams 240 may be irradiated onto a predetermined area of the amorphous silicon layer 132. As illustrated in FIG. 8, the amorphous silicon layer 132 may be converted into a polycrystalline silicon layer 134 in a region in which the crystallization process is performed using the laser beam 240.

As a result, although the doping process, cleaning process, rinsing process, and crystallization process for forming the polycrystalline silicon layer 134 have been described, it may be possible to add processes for forming the polycrystalline silicon layer 134 in addition to the above processes or omit some of the processes. In addition, it may be possible to perform the above processes a plurality of times. For example, the crystallization process may be performed two or more times.

Hereinafter, a thin film transistor substrate and a method of manufacturing the same according to an embodiment will be described with reference to FIG. 9 to FIG. 12.

FIG. 9 to FIG. 12 illustrate cross-sectional views showing a manufacturing method of a thin film transistor substrate according to an embodiment. Hereinafter, in describing a method of manufacturing a thin film transistor substrate according to an embodiment, a detailed description of a portion overlapping the method of manufacturing the polycrystalline silicon layer according to the embodiment will be omitted.

Figure 9:
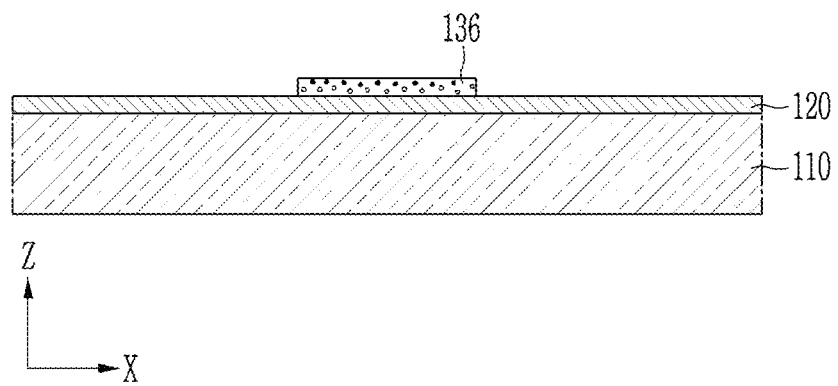
FIG. 9, 10, 11 and FIG. 12 illustrate cross-sectional views showing a manufacturing method of a thin film transistor substrate according to an embodiment.

Referring to FIG. 9, a polycrystalline silicon pattern 136 may be formed by etching the polycrystalline silicon layer 134 disposed on the substrate 110 and the buffer layer 120. The polycrystalline silicon layer 134 may be manufactured by the manufacturing method of the polycrystalline silicon layer 134 according to the embodiment described above. Thus, the polycrystalline silicon layer 134 includes the N-type impurity D1 and the P-type impurity D2. In this case, the P-type impurity D2 may be included near a surface of the polycrystalline silicon layer 134 and the N-type impurity D1 may be included near a bottom of the polycrystalline silicon layer 134 adjacent to the buffer layer 120. A boundary between an n-doped polycrystalline silicon and a p-doped polycrystalline silicon may not be clearly present. However, the concentration of the P-type impurity D2 decreases as a distance from the surface of the polycrystalline silicon layer 134 increases and the concentration of the N-type impurity D1 decreases as it approaches the surface of the polycrystalline silicon layer 134. Within the polycrystalline silicon layer 134, the concentration of the P-type impurity D2 is 1e14 atoms/cm$^2$ or more and 1e16 atoms/cm$^2$ or less, and the concentration of the N-type impurity D1 is 1e14 atoms/cm$^2$ or more and 1e16 atoms/cm$^2$ or less.

The polycrystalline silicon layer 134 may be etched by photolithography. For example, a photoresist pattern may be formed on the polycrystalline silicon layer 134 using an exposure process and a developing process, and the polycrystalline silicon layer 134 may be etched by using the photoresist pattern as an etch mask.

Figure 10:
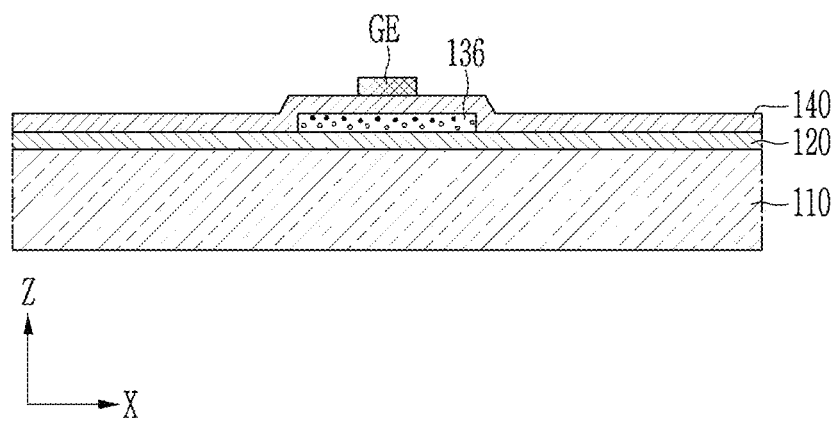

Referring to FIG. 10, a gate insulating layer 140 and a gate electrode GE may be disposed on the polycrystalline silicon pattern 136. The gate insulating layer 140 may be disposed on the buffer layer 120 to cover the polycrystalline silicon pattern 136. The gate insulating layer 140 may insulate the gate electrode GE from the polycrystalline silicon pattern 136. For example, the gate insulating layer 140 may be formed using a silicon oxide, a silicon nitride, or the like.

The gate electrode GE may overlap the polycrystalline silicon pattern 136. The gate electrode GE may include gold (Au), silver (Ag), aluminum (Al), copper (Cu), nickel (Ni) platinum (Pt), magnesium (Mg), chromium (Cr), tungsten (W), molybdenum (Mo), titanium (Ti), or an alloy thereof, and may have a single layer or a multilayer structure including different metal layers. For example, the gate electrode GE may include a triple layer of molybdenum/aluminum/molybdenum, a double layer of copper/titanium, or the like.

For example, a first metal layer and a photoresist pattern overlapping the polycrystalline silicon pattern 136 may be positioned on the gate insulating layer 140. Then, the gate electrode GE may be formed by etching the first metal layer using the photoresist pattern.

Figure 11:
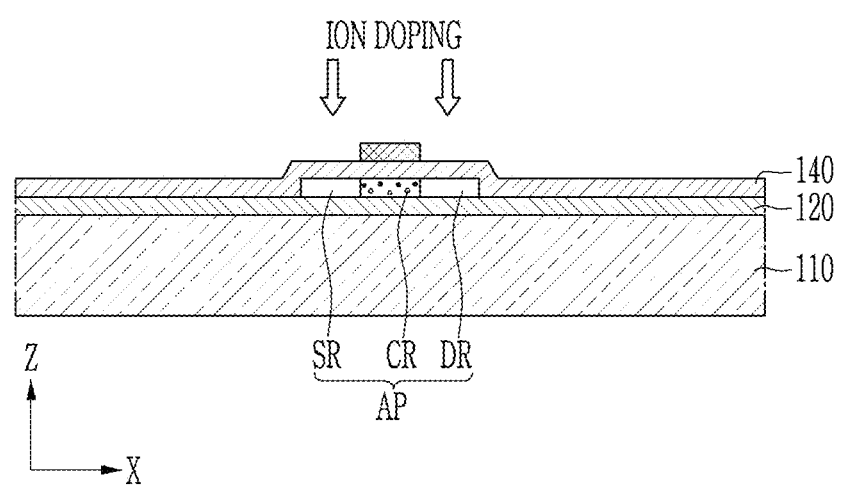

Referring to FIG. 11, ions may be partially implanted into the polycrystalline silicon pattern 136 to dope a source region SR and a drain region DR. The source region SR, the drain region DR and a channel region may constitute an active pattern AP.

Such an ion implantation process may be performed by using the gate electrode GE as a mask. That is, in the polycrystalline silicon pattern 136, a region overlapping the gate electrode GE remains undoped with ions to form the channel region CR, and remaining regions are doped to form the source region SR and the drain region DR. The ions may be the N-type impurity or the P-type impurity.

In this ion implantation process, a portion of the polycrystalline silicon pattern 136 overlapping the gate electrode GE remains undoped with ions to become the channel region CR. However, as described above, since the N-type impurity D1 and the P-type impurity D2 are already included in the polycrystalline silicon pattern 136, the N-type impurity D1 and the P-type impurity D2 are also included in the channel region CR. That is, the concentration of the P-type impurity D2 included in the channel region CR increases as it approaches the gate insulating layer 140, and the concentration of the N-type impurity D1 increases as a distance from the gate insulating layer 140 increases. Within the channel region CR, the concentration of the P-type impurity D2 is 1e14 atoms/cm$^2$ or more and 1e16 atoms/cm$^2$ or less, and the concentration of the N-type impurity D1 is 1e14 atoms/cm$^2$ or more and 1e16 atoms/cm$^2$ or less. Within the channel region CR, the concentration of the P-type impurity D2 and the concentration of the N-type impurity D1 may be substantially the same. As such, even when the P-type impurity D2 is present near an upper surface of the polycrystalline silicon layer 134 to prevent generation of circular spots on the surface of the polycrystalline silicon layer 134, the N-type impurity D1 of substantially the same concentration exists in the channel region CR, and thus characteristics of the transistor may not be affected by the impurities.

Meanwhile, a portion of the polycrystalline silicon pattern 136 additionally doped with ions increases conductivity and thus has a property of a conductor, and thus may become the source region SR and the drain region DR. The channel region CR may be formed between the source region SR and the drain region DR.

The thickness of the obtained active pattern may be 300 Å or more and 500 Å or less.

Figure 12:
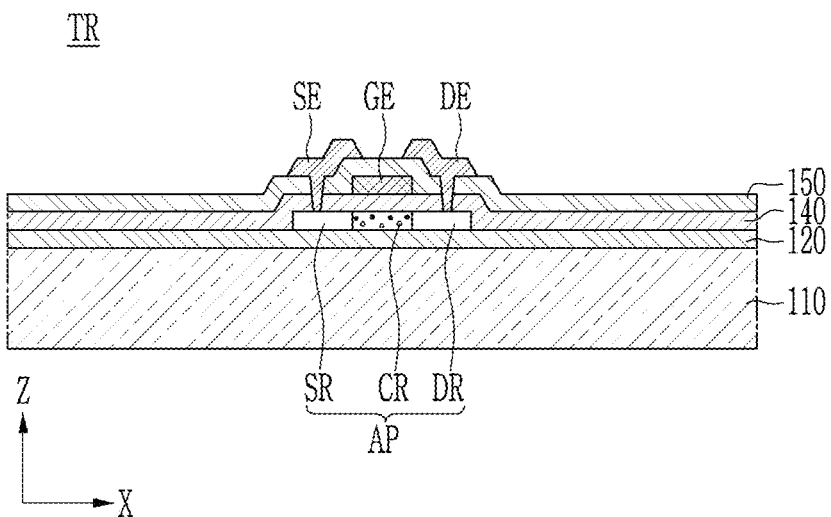

Referring to FIG. 12, an interlayer insulating layer 150, a source electrode SE, and a drain electrode DE may be disposed on the gate electrode GE.

The interlayer insulating layer 150 may be disposed on the gate insulating layer 140 to cover the gate electrode GE. The interlayer insulating layer 150 may insulate the source electrode SE and the drain electrode DE from the gate electrode GE.

The interlayer insulating layer 150 may include an inorganic insulating layer, an organic insulating layer, or a combination thereof. For example, the interlayer insulating layer 150 may include a silicon oxide, a silicon nitride, a silicon carbide, or a combination thereof, and may include an insulating metal oxide such as an aluminum oxide, a tantalum oxide, a hafnium oxide, a zirconium oxide, or a titanium oxide. When the interlayer insulating layer 150 includes an organic insulating layer, it may include a polyimide, a polyamide, an acrylic resin, a phenol resin, a benzocyclobutene (BCB), or the like.

Thereafter, the interlayer insulating layer 150 and the gate insulating layer 140 may be etched to form through holes exposing the source region SR and the drain region DR, respectively.

Subsequently, the source electrode SE and the drain electrode DE that are respectively electrically connected to the source region SR and the drain region DR of the active pattern AP may be disposed on the interlayer insulating layer 150. That is, the source electrode SE in contact with the source region SR and the drain electrode DR in contact with the drain region DR may be formed by forming a source contact hole and a drain contact hole, and forming a second metal layer on the interlayer insulating film 150 in which the source contact hole and a drain contact hole are formed and patterning it. For example, each of the source electrode SE and the drain electrode DR may include gold (Au), silver (Ag), aluminum (Al), copper (Cu), nickel (Ni), platinum (Pt), magnesium (Mg), chromium (Cr), tungsten (W), molybdenum (Mo), titanium (Ti), or an alloy thereof, and may have a single layer or a multilayer structure including different metal layers. For example, the source electrode SE and the drain electrode DR may each include a triple layer of molybdenum/aluminum/molybdenum, a double layer of copper/titanium, or the like.

According to an embodiment, when an amorphous silicon layer is formed before the crystallization process, it is possible to prevent circular spots that may be generated during the subsequent cleaning process using hydrofluoric acid and the rinse process using deionized water without affecting the device characteristics by forming the second amorphous silicon layer containing the P-type impurity on the first amorphous silicon layer containing the N-type impurity. Accordingly, a thin film transistor TR with improved characteristics such as threshold voltage distribution and hysteresis may be formed.

Hereinafter, a display device and a manufacturing method thereof according to an embodiment will be described in detail with reference to FIG. 13 and FIG. 14.

Figure 13:
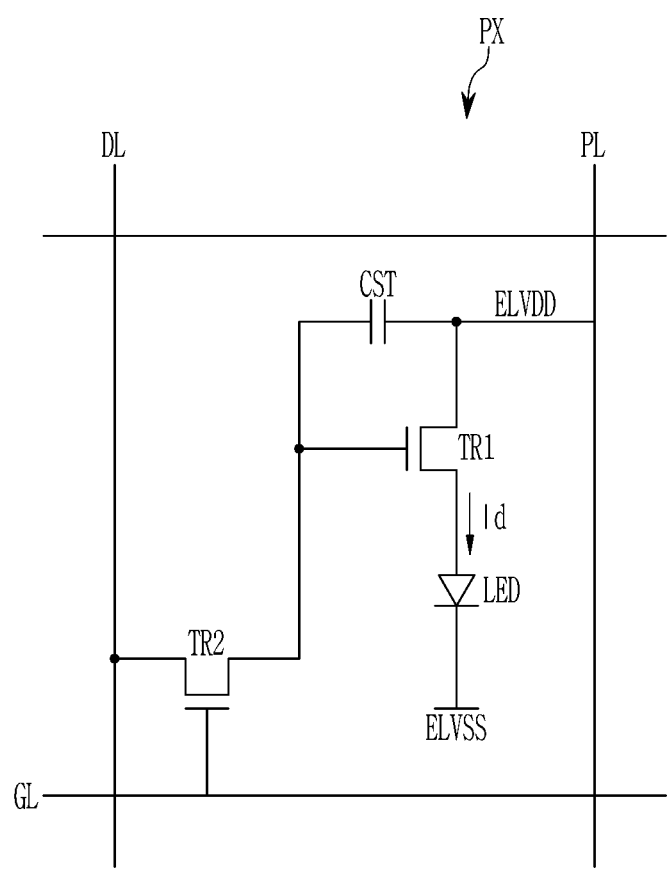
FIG. 13 illustrates an equivalent circuit diagram of one pixel of a display device according to an embodiment.
Figure 14:
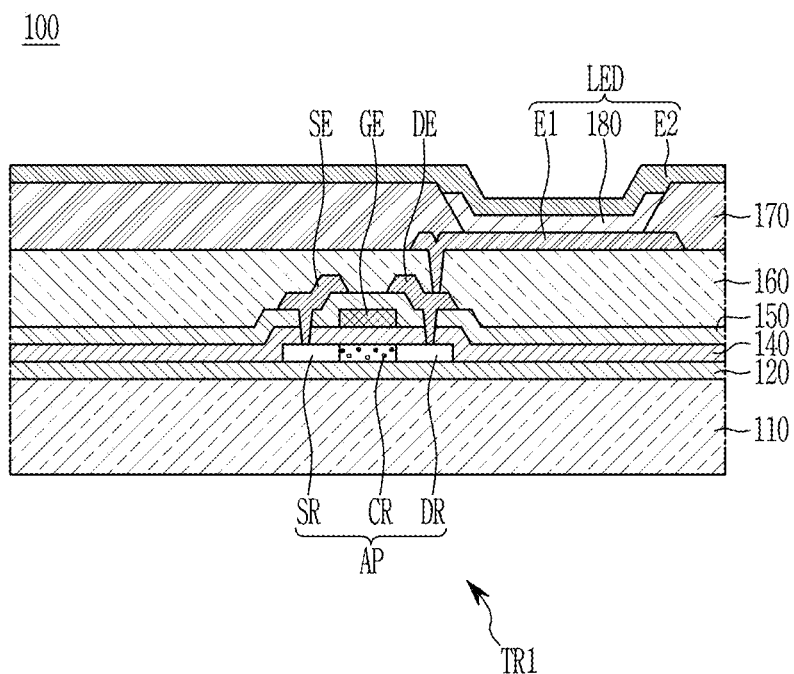
FIG. 14 illustrates a cross-sectional view showing a display device according to an embodiment.

FIG. 13 illustrates an equivalent circuit diagram of one pixel of a display device according to an embodiment, and FIG. 14 illustrates a cross-sectional view showing a display device according to an embodiment.

Referring to FIG. 13, each of the display device according to the embodiment includes signal lines, for example, a gate line GL, a data line DL, and a driving voltage line PL, and a pixel PX connected thereto. The display device may include a plurality of pixels arranged in a substantially matrix configuration. Each of the plurality of pixels may be connected to a respective GL, a respective DL and a respective PL.

The signal lines may include gate lines GL for transmitting gate signals (or scan signals), data lines DL for transmitting data voltages, and driving voltage lines PL for transmitting a driving voltage ELVDD. The gate lines GL may extend in a substantially row direction. The data lines DL and the plurality of pixels may intersect the gate lines GL to extend in a substantially column direction. Each of the pixels PX may include a driving transistor TR1, a switching transistor TR2, a storage capacitor CST, and a light emitting diode (LED).

The driving transistor TR1 may include a control terminal, an input terminal, and an output terminal. The control terminal may be connected to the switching transistor TR2. The input terminal may be connected to the driving voltage line PL. The output terminal may be connected to the light emitting diode LED. The driving transistor TR1 may transfer an output current Id having a magnitude that varies depending on a voltage applied between the control terminal and the output terminal of the driving transistor TR1 to the light emitting diode LED.

The switching transistor TR2 may include a control terminal, an input terminal, and an output terminal. The control terminal may be connected to the gate line GL. The input terminal may be connected to the data line DL. The output terminal may be connected to the control terminal of the driving transistor TR1. The switching transistor TR2 may transfer a data voltage supplied from the data line DL to the control electrode of the driving transistor TR1 in response to a gate signal applied to the gate line GL.

The storage capacitor CST may be connected between the control terminal and the input terminal of the driving transistor TR1. The storage capacitor CST may charge a voltage difference between the power line PL and the data voltage applied to the control terminal of the driving transistor TR1, and may maintain it even after the switching transistor TR2 is turned off.

The light emitting diode LED may include an anode connected to the output terminal of the driving transistor TR1 and a cathode connected to the common voltage ELVSS. The light emitting diode LED may display an image by emitting light with different brightness depending on the output current Id of the driving transistor TR1.

In an embodiment, each pixel PX has been described as including two thin film transistors TR1 and TR2 and one capacitor CST, but the present inventive concept is not limited thereto. In another embodiment, each pixel PX may include three or more thin film transistors or two or more capacitors.

Referring to FIG. 14, a display device 100 according to an embodiment may include a substrate 110, a thin film transistor disposed on the substrate 110, and a display element disposed on the thin film transistor. In an embodiment, the display device 100 may include a light emitting diode LED, e.g., an organic light emitting diode, as the display element. However, the present inventive concept is not limited thereto, and in another embodiment, the display device 100 may include various other display elements.

The thin film transistor TR1 and the light emitting diode LED illustrated in FIG. 14 may correspond to the driving transistor TR1 and the light emitting diode LED illustrated in FIG. 13, respectively. Meanwhile, the display device 100 according to the embodiment may include a thin film transistor TR according to the embodiment illustrated in FIG. 12. In addition, in an embodiment, although it has been described that the driving transistor TR1 includes polycrystalline silicon, it is not necessarily limited thereto, and other transistors included in the pixel PX may be formed to have an active layer including other materials such as amorphous silicon or an oxide semiconductor.

In an embodiment, the driving transistor TR1 illustrated in FIG. 13 includes an active layer containing polycrystalline silicon, but the switching transistor TR2 (in FIG. 13) may include an active layer containing an oxide semiconductor. In this case, the oxide semiconductor may include at least one of a primary metal-based oxide such as an indium oxide, a tin oxide, or a zinc oxide, a binary metal-based oxide such as an In—Zn-based oxide, an Sn—Zn-based oxide, an Al—Zn-based oxide, a Zn—Mg-based oxide, a Sn—Mg-based oxide, an In—Mg-based oxide, or an In—Ga-based oxide, a ternary metal-based oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a quaternary metal-based oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide. For example, the oxide semiconductor may be an IGZO (In—Ga—Zn—O) semiconductor in which a metal such as indium (In) or gallium (Ga) is contained in ZnO. However, it is not necessarily limited thereto, and various modifications may be made according to another embodiment.

When the active layer of the thin film transistor includes an oxide semiconductor, it has a low off-current and low-frequency driving is possible. Accordingly, since any one of the driving transistors TR1 and the switching transistor TR2 is configured to include an oxide semiconductor layer, power consumption of the display device 100 may be reduced.

The light emitting diode LED may include a first electrode E1, an emission layer 180, and a second electrode E2 that are sequentially stacked. The light emitting diode LED may display an image by emitting light based on a driving current transferred from the driving transistor TR1.

First, a planarization layer (or protective layer) 160 may be disposed on the source electrode SE and the drain electrode DE to planarize a surface on which the light emitting diode (LED) is formed. The planarization layer 160 may be disposed on the interlayer insulating layer 150 to cover the source electrode SE and the drain electrode DE. The planarization layer 160 may insulate the first electrode E1 from the source electrode SE and the drain electrode DE.

The planarization layer 160 may include an organic insulating layer, an inorganic insulating layer, or a combination thereof. For example, the planarization layer 160 may have a single or multi-layered structure of a silicon nitride or a silicon oxide. When the planarization layer 160 includes an organic insulating layer, it may include a polyimide, an acrylic resin, a phenol resin, a benzocyclobutene (BCB), a polyamide, or the like.

Next, the planarization layer 160 is patterned to form a contact hole exposing the drain electrode DE. A first electrode E1 electrically connected to the drain electrode DE may be formed on the planarization layer 160. For example, a third metal layer may be disposed on the planarization layer 160 in which the contact hole exposing the drain electrode DE is formed and patterned to form a first electrode E1 in contact with the drain electrode DE through a contact hole.

The first electrode E1 may be a pixel electrode of the display device. The first electrode E1 may be formed as a transmitting electrode or a reflecting electrode depending on a type of light emission of the display device. When the first electrode E1 is formed as the transmitting electrode, the first electrode E1 may include an indium tin oxide (ITO), an indium zinc oxide (IZO), a zinc tin oxide (ZTO), an indium oxide ($In_2O_3$), a zinc oxide (ZnO), a tin oxide ($SnO_2$), etc. When the first electrode E1 is formed as the reflecting electrode, the first electrode E1 may include gold (Au), silver (Ag), aluminum (Al), copper (Cu), nickel (Ni), platinum (Pt), magnesium (Mg), chromium (Cr), tungsten (W), molybdenum (Mo), titanium (Ti), and the like, and may have a stacked structure with a material used for the transmitting electrode.

A pixel defining layer 170 may be disposed on the planarization layer 160 on the first electrode E1. The pixel defining layer 170 may have an opening exposing at least a portion of the first electrode E1. For example, the pixel defining layer 170 may include an organic insulating material.

An emission layer 180 may be disposed on the first electrode E1. The emission layer 180 may be disposed on an upper surface of the first electrode E1 exposed by the opening of the pixel defining layer 170. For example, the emission layer 180 may be formed by a method such as screen printing, inkjet printing, or vapor deposition.

The emission layer 180 may include a low molecular organic compound or a high molecular organic compound. For example, the organic emission layer 180 may include the low-molecular organic compound such as copper phthalocyanine, N,N'-diphenylbenzidine, tris-(8-hydroxyquinoline) aluminum, or the like. In addition, the emission layer 180 may include the polymer organic compound such as poly (3,4-ethylenedioxythiophene), polyaniline, poly-phenylenevinylene, polyfluorene, or the like.

In an embodiment, the emission layer 180 may emit red light, green light, or blue light. In another embodiment, when the emission layer 180 emits white light, the emission layer 180 may include a multilayer structure including a red emission layer, a green emission layer, and a blue emission layer, or may include a single-layer structure including a red emission material, a green emission material, and a blue emission material.

In an embodiment, a hole injection layer and/or a hole transport layer may be further disposed between the first electrode E1 and the emission layer 180, or an electron transport layer and/or an electron injection layer may be further disposed on the emission layer 180.

A second electrode E2 may be disposed on the emission layer 180. The second electrode E2 may be a common electrode of the display device. The second electrode E2 may be formed as a transmitting electrode or a reflecting electrode depending on a light emission type of the display device. For example, when the second electrode E2 is formed as a transparent electrode, the second electrode E2 may include lithium (Li), calcium (Ca), lithium fluoride (LiF), aluminum (Al), magnesium (Mg), or a combination thereof.

The display device 100 and the transistor TR formed as described above may improve device characteristics by including a polycrystalline silicon layer manufactured according to an embodiment, a detailed description of which will be described later with reference to FIG. 15, FIG. 16A, FIG. 16B, and FIG. 17.

Figure 15:
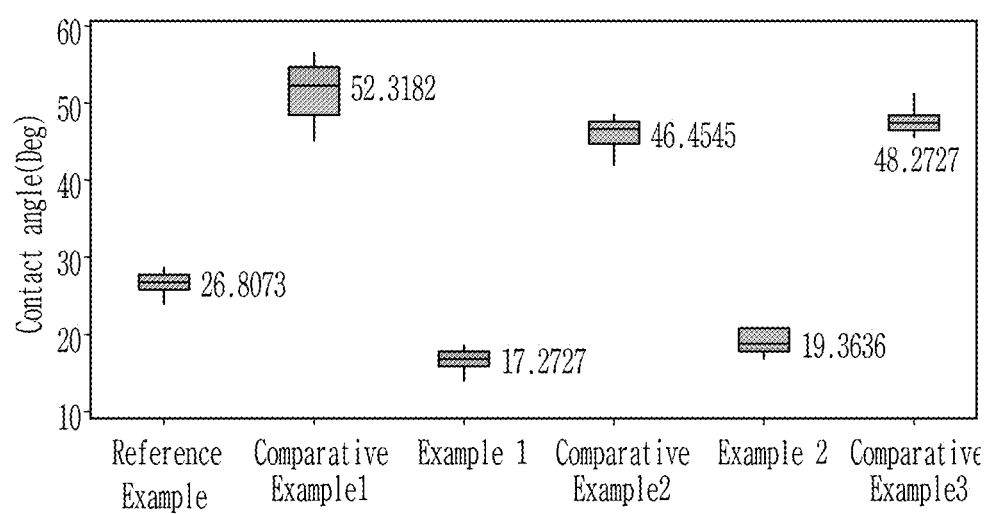
FIG. 15 illustrates a graph showing results of measuring a contact angle with water before crystallization of an amorphous silicon layer in examples and comparative examples.
Figure 16A:
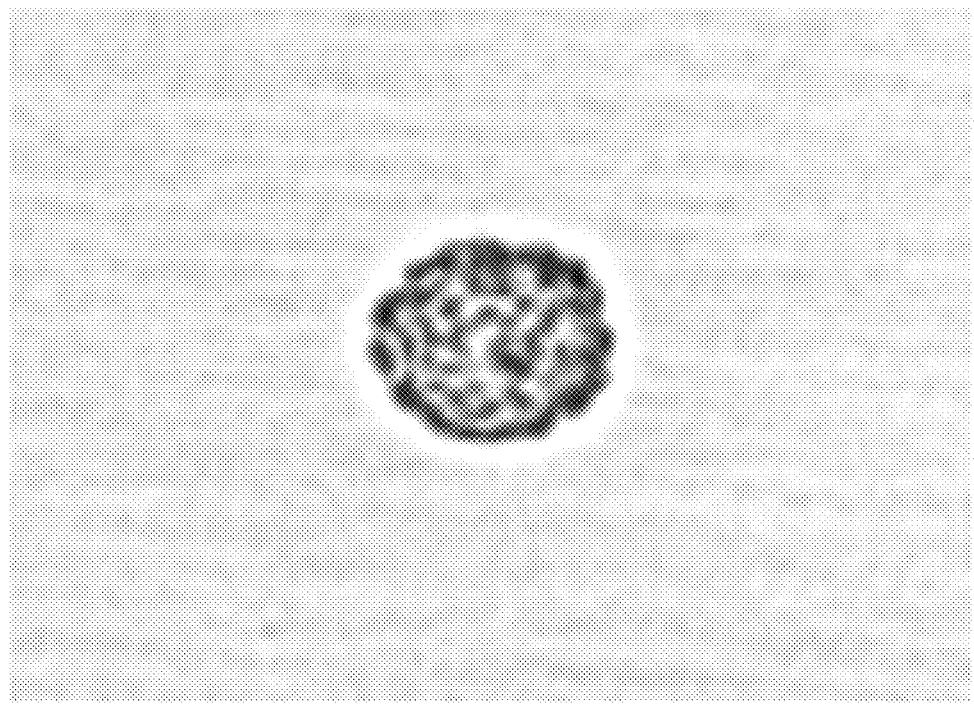
FIG. 16A and FIG. 16B illustrate photographs showing microscopic observation of a surface of a polycrystalline silicon layer in examples and comparative examples.
Figure 16B:
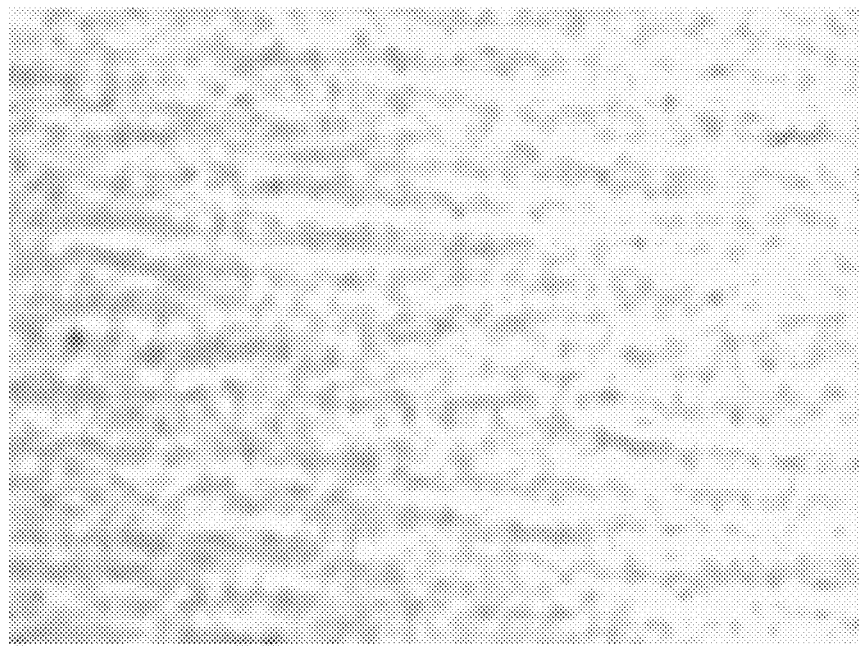
Figure 17:
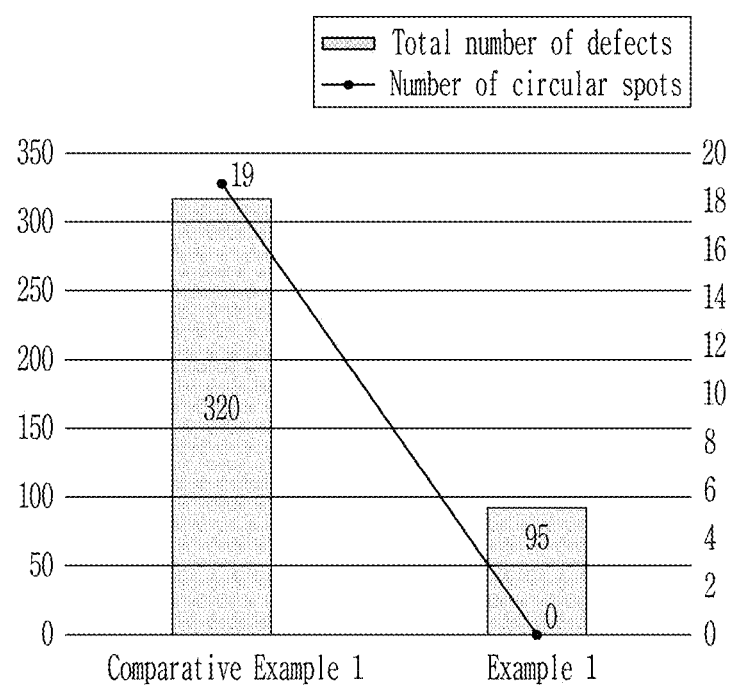
FIG. 17 illustrates a graph showing a number of defects in examples and comparative examples.

FIG. 15 illustrates a graph showing results of measuring a contact angle with water before crystallization of an amorphous silicon layer in examples and comparative examples, FIG. 16A and FIG. 16B illustrate photographs showing microscopic observation of a surface of a polycrystalline silicon layer in examples and comparative examples, and FIG. 17 illustrates a graph showing a number of defects in examples and comparative examples.

Six samples indicated on a horizontal axis in FIG. 15 are as follows.

Reference example: amorphous silicon layer without any treatment.

Comparative Example 1: Sample in which the surface of the amorphous silicon layer was washed with hydrofluoric acid for 60 s.

Example 1: Sample doped with 1e14 atoms/cm$^2$ of phosphorus (P) on the first amorphous silicon layer and 1e14 atoms/cm$^2$ of boron (B) on the second amorphous silicon layer, and washed with hydrofluoric acid for 60 s.

Comparative Examples 2: Sample doped with 1e12 atoms/cm$^2$ of phosphorus (P) on the first amorphous silicon layer and 1e12 atoms/cm$^2$ of boron (B) on the second amorphous silicon layer, and washed with hydrofluoric acid for 60 s.

Example 2: Sample doped with 1e14 atoms/cm$^2$ of phosphorus (P) on the first amorphous silicon layer and 1e14 atoms/cm$^2$ of fluorine (F) on the second amorphous silicon layer, and washed with hydrofluoric acid for 60 s.

Comparative Examples 3: Sample doped with 1e12 atoms/cm$^2$ of phosphorus (P) on the first amorphous silicon layer and 1e12 atoms/cm$^2$ of fluorine (F) on the second amorphous silicon layer, and washed with hydrofluoric acid for 60 s.

FIG. 15 illustrates results of measuring a contact angle with water on a surface of each sample. As illustrated in FIG. 15, in the case of Comparative Example 1 in which only washing with hydrofluoric acid was performed, it can be seen that the contact angle is largely increased because the surface has a hydrophobic characteristic. On the other hand, it was confirmed that in the case of Examples 1 and 2 in which the P-type impurity was doped at 1e14 atoms/cm$^2$ or more on the surface, the contact angle was significantly lowered. In addition, it was confirmed that even when the P-type impurity was doped, the contact angle was still high in Comparative Examples 2 and 3 in which a doping concentration was less than 1e14 atoms/cm$^2$.

Next, device characteristics of the display device including the polycrystalline silicon layer obtained from Comparative Example 1 and Example 1 were measured. The measured values are as follows.

TABLE 1

|  | Threshold voltage [V] | Dr_range [V] | Mobility [cm$^2$/V · s] | Hysteresis [V] |
| --- | --- | --- | --- | --- |
| Comparative Example 1 | −3.46 | −3.30 | 64.32 | 0.182 |
| Example 1 | −3.26 | −3.36 | 64.66 | 0.161 |

As shown in Table 1, it can be seen that a median value of a threshold voltage Vth of Comparative Example 1 is −3.46[V] and a median value of the threshold voltage Vth of Example 1 is −3.26[V]. Example 1 to which an additional doping is performed still has a similar threshold voltage as that of the comparative Example 1. In addition, the hysteresis that is defined by a difference in a driving range, a mobility and the threshold voltage (delta Vth) in the Example 1 in which additional doping was performed and in the Comparative Example 1 in which no doping was performed has substantially the same value.

Next, results of observing surfaces of the polycrystalline silicon layers obtained from Comparative Example 1 and Example 1 under a microscope are shown in FIG. 16A and FIG. 16B.

Circular spots are generated on the surface of the polycrystalline silicon layer of Comparative Example 1 as illustrated in FIG. 16A, whereas circular spots are not generated on the surface of the polycrystalline silicon layer of Example 1 as illustrated in FIG. 16B.

Total number of defects and a number of circular spots for samples having same size were determined and are shown in FIG. 17. As illustrated in FIG. 17, it was confirmed that, in the case of Example 1, the total number of defects and the number of circular spots were significantly reduced as compared to the Comparative Example 1. For example, the circular spots of 19 were observed in Comparative Example 1, while no circular spot was found in Example 1. In the case of Example 1, it is possible to significantly reduce circular spots on the surface while maintaining excellent device characteristics by maintaining the advantage of the cleaning process using such hydrofluoric acid.

As a result, it can be seen that, in accordance with the polycrystalline silicon layer according to an embodiment, it is possible to prevent pixel defects due to circular spots by preventing generation of circular spots, particularly without deteriorating the device characteristics.

While this disclosure has been described in connection with what is presently considered to be practical embodiments, it is to be understood that the inventive concept is not limited to the disclosed embodiments, but, on the contrary, is intended to cover various modifications and equivalent arrangements included within the spirit and scope of the appended claims.

What is claimed is:

1. A manufacturing method of a polycrystalline silicon layer, the method comprising:
   forming a first amorphous silicon layer on a substrate;
   doping an N-type impurity into the first amorphous silicon layer to form an n-doped first amorphous silicon layer;
   forming a second amorphous silicon layer on the n-doped first amorphous silicon layer;
   doping a P-type impurity into the second amorphous silicon layer to form a p-doped second amorphous silicon layer; and
   crystallizing the n-doped first amorphous silicon layer and the p-doped second amorphous silicon layer by irradiating a laser beam onto the n-doped first amorphous silicon layer and the p-doped second amorphous silicon layer to form a polycrystalline silicon layer.

2. The manufacturing method of claim 1, further comprising cleaning the substrate on which the n-doped first amorphous silicon layer and the p-doped second amorphous silicon layer is disposed before the crystallizing the n-doped first amorphous silicon layer and the p-doped second amorphous silicon layer,
   wherein the cleaning of the substrate includes:
   cleaning the substrate with hydrofluoric acid; and
   rinsing the substrate with deionized water.

3. The manufacturing method of claim 2, wherein a contact angle with respect to water measured on a surface of the p-doped second amorphous silicon layer is less than 20 degrees after the cleaning of the p-doped second amorphous silicon layer with hydrofluoric acid.

4. The manufacturing method of claim 1, wherein a thickness of the first amorphous silicon layer is 150 Å or more and 250 Å or less.

5. The manufacturing method of claim 1, wherein a thickness of the second amorphous silicon layer is 150 Å or more and 250 Å or less.

6. The manufacturing method of claim 1, wherein the doping of the N-type impurity proceeds with an acceleration voltage of more than 0 and 20 keV or less and a dose of 1e14 atoms/cm2 or more and 1e16 atoms/cm2 or less.

7. The manufacturing method of claim 1, wherein the doping of the P-type impurity proceeds with an acceleration voltage of more than 0 and 20 keV or less and a dose of 1e14 atoms/cm2 or more and 1e16 atoms/cm2 or less.

8. A display device comprising:
   a substrate;
   a thin film transistor disposed on the substrate; and
   a display element disposed on the thin film transistor,
   wherein the thin film transistor includes:
   an active pattern disposed on the substrate, the active pattern including a source region, a drain region, and a channel region disposed between the source region and the drain region;
   a gate insulating layer disposed on the active pattern; and
   a gate electrode disposed on the gate insulating layer in a region corresponding to the channel region,
   wherein the channel region includes an N-type impurity and a P-type impurity, and
   wherein concentration of the P-type impurity increases as the channel region approaches the gate insulating layer.

9. The display device of claim 8, wherein concentration of the N-type impurity increases as a distance from the gate insulating layer increases.

10. The display device of claim 8, wherein the P-type impurity is any one of boron (B) and fluorine (F).

11. The display device of claim 8, wherein the N-type impurity is phosphorus (P).

12. The display device of claim 8, wherein a thickness of the active pattern is 300 Å or more and 500 Å or less.

13. The display device of claim 8, wherein concentration of the P-type impurity in the channel region is 1e14 atoms/cm2 or more and 1e16 atoms/cm2 or less.

14. The display device of claim 8, wherein concentration of the N-type impurity in the channel region is 1e14 atoms/cm2 or more and 1e16 atoms/cm2 or less.

15. The display device of claim 8, wherein concentration of the P-type impurity and concentration of the N-type impurity within the channel region are substantially the same.

16. The display device of claim 8, wherein the thin film transistor further includes a source electrode and a drain electrode that are electrically connected to the source region and the drain region, respectively.

17. The display device of claim 8, wherein the display element includes:
a first electrode electrically connected to the thin film transistor;
an emission layer disposed on the first electrode; and
a second electrode disposed on the emission layer.

18. A manufacturing method of a display device, the method comprising:
forming a first amorphous silicon layer on a substrate;
doping an N-type impurity into the first amorphous silicon layer to form an n-doped first amorphous silicon layer;
forming a second amorphous silicon layer on the first amorphous silicon layer;
doping a P-type impurity into the second amorphous silicon layer to form a p-doped second amorphous silicon layer;
crystalizing the n-doped first amorphous silicon layer and the p-doped second amorphous silicon layer by irradiating a laser beam onto the n-doped first amorphous silicon layer and the p-doped second amorphous to form a polycrystalline silicon layer;
forming a polycrystalline silicon pattern by patterning the polycrystalline silicon layer;
forming a gate insulating layer on the polycrystalline silicon pattern;
forming a gate electrode on the gate insulating layer;
forming a source region, a drain region, and a channel region between the source region and the drain region by doping the polycrystalline silicon pattern;
forming a display element on the gate electrode.

19. The manufacturing method of claim 18, further comprising cleaning the substrate on which the n-doped first amorphous silicon layer and the p-doped second amorphous silicon layer is disposed before the crystalizing the n-doped first amorphous silicon layer and the p-doped second amorphous silicon layer,
wherein the cleaning of the substrate includes:
cleaning the substrate with hydrofluoric acid; and rinsing the substrate with deionized water.

20. The manufacturing method of claim 18, wherein the doping of the N-type impurity proceeds with an acceleration voltage of more than 0 and 20 keV or less and a dose of 1e14 atoms/cm2 or more and 1e16 atoms/cm2 or less.

21. The manufacturing method of claim 18, wherein the doping of the P-type impurity proceeds with an acceleration voltage of more than 0 and 20 keV or less and a dose of 1e14 atoms/cm2 or more and 1e16 atoms/cm2 or less.

22. The manufacturing method of claim 18, further comprising cleaning the substrate on which the n-doped first amorphous silicon layer and the p-doped second amorphous silicon layer is disposed before the crystalizing the n-doped first amorphous silicon layer and the p-doped second amorphous silicon layer,
wherein a contact angle with respect to water measured on a surface of the p-doped second amorphous silicon layer is less than 20 degrees after the cleaning of the p-doped second amorphous silicon layer with hydrofluoric acid.

23. The manufacturing method of claim 18, wherein the forming the source region, the drain region, and the channel region between the source region and the drain region by doping the polycrystalline silicon pattern is performed by an ion implantation using the gate electrode as a mask.

24. The manufacturing method of claim 18, further comprising:
forming a source electrode and a drain electrode, the source electrode and the drain electrode being electrically connected to the source region and the drain region, respectively.

25. The manufacturing method of claim 18, wherein the forming of the display element includes:
forming a first electrode, the first electrode being electrically connected to the p-doped second amorphous silicon layer;
forming an emission layer on the first electrode; and
forming a second electrode on the emission layer.

* * * * *